United States Patent
Kim et al.

(10) Patent No.: US 8,218,365 B2
(45) Date of Patent: Jul. 10, 2012

(54) FLASH MEMORY DEVICE HAVING DUMMY CELLS AND METHOD OF OPERATING THE SAME

(75) Inventors: Moo-Sung Kim, Yongin-si (KR); Young-Ho Lim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 337 days.

(21) Appl. No.: 12/407,393

(22) Filed: Mar. 19, 2009

(65) Prior Publication Data

US 2009/0244967 A1 Oct. 1, 2009

(30) Foreign Application Priority Data

Mar. 31, 2008 (KR) .................................. 2008-29876

(51) Int. Cl.
*G11C 11/40* (2006.01)
(52) U.S. Cl. ................. 365/185.2; 365/185.17
(58) Field of Classification Search ............. 365/184.17, 365/185.2, 185.22, 185.25, 185.29
See application file for complete search history.

(56) References Cited

U.S. PATENT DOCUMENTS

| | | | |
|---|---|---|---|
| 7,023,736 B2 | 4/2006 | Cernea et al. | |
| 7,079,437 B2* | 7/2006 | Hazama et al. | 365/210.12 |
| 7,272,049 B2 | 9/2007 | Kang et al. | |
| 7,480,172 B2* | 1/2009 | Shi et al. | 365/158 |
| 7,755,944 B2* | 7/2010 | Hwang et al. | 365/185.11 |
| 2006/0139997 A1* | 6/2006 | Park et al. | 365/185.2 |
| 2007/0159886 A1* | 7/2007 | Kang | 365/185.17 |
| 2007/0279981 A1* | 12/2007 | Abe et al. | 365/185.2 |
| 2008/0137409 A1* | 6/2008 | Nakamura et al. | 365/185.2 |
| 2008/0239822 A1* | 10/2008 | Kosaki et al. | 365/185.17 |
| 2008/0273388 A1* | 11/2008 | Chin et al. | 365/185.17 |
| 2009/0021982 A1* | 1/2009 | Matsunaga et al. | 365/185.17 |

FOREIGN PATENT DOCUMENTS

| | | |
|---|---|---|
| JP | 2007080477 | 3/2007 |
| KR | 1020060070734 | 6/2006 |
| KR | 1020070018216 | 2/2007 |
| KR | 1020070029299 | 3/2007 |

* cited by examiner

*Primary Examiner* — Douglas King

(74) *Attorney, Agent, or Firm* — Volentine & Whitt, PLLC

(57) ABSTRACT

Disclosed is a flash memory device having multiple strings, where each string includes first memory cells and second memory cells. One second memory cell of the second memory cells in each string is set to a programmed state, and remaining second memory cells are set to an erased state.

5 Claims, 8 Drawing Sheets

US 8,218,365 B2

FLASH MEMORY DEVICE HAVING DUMMY CELLS AND METHOD OF OPERATING THE SAME

PRIORITY CLAIM

A claim of priority is made to Korean Patent Application No. 10-2008-0029876, filed on Mar. 31, 2008, in the Korean Intellectual Property Office, the subject matter of which is hereby incorporated by reference.

SUMMARY

Embodiments of the present invention relate to a flash memory device. More particularly, embodiments of the present invention relate to a program verify method of a flash memory device using dummy cells.

Flash memory devices having conventional All Bit Line (ABL) architecture are able to program memory cells of a selected word line and all bit lines at one time. Generally, ABL flash memory devices perform verify and read operations twice with respect to programmed cells because an incorrect read operation may otherwise occur due to coupling capacitances between adjacent bit lines when there are adjacent programmed or erased cells in the same word line. Also, a bias voltage of a source connected in common with all bit lines is maintained constantly. An example of a flash memory device having ABL architecture is disclosed in U.S. Pat. No. 7,023,736, issued Apr. 4, 2006, the contents of which are hereby incorporated by reference.

Program verification and/or read times of a flash memory device having ABL architecture may be increased due to continuous verify or read operations.

One aspect of the present invention provides a flash memory device having multiple strings, where each string includes first memory cells and second memory cells. One second memory cell of the second memory cells in each string is set to a programmed state, and remaining second memory cells are set to an erased state. The second memory cells may be dummy cells.

Another aspect of the present invention provides a method of operating a flash memory device having multiple strings. The operating method includes pre-charging the strings at the same time, each string having first memory cells and second memory cells. The operating method further includes sensing first strings of the multiple strings and sensing second strings of the multiple strings. One of the second memory cells in each of the strings is set to a programmed state and each of remaining second memory cells in each of the strings is set to an erased state.

BRIEF DESCRIPTION OF THE FIGURES

The embodiments of the present invention will be described with reference to the attached figures, wherein like reference numerals refer to like parts throughout the various figures unless otherwise specified.

DETAILED DESCRIPTION OF THE EMBODIMENTS

Figure 1:
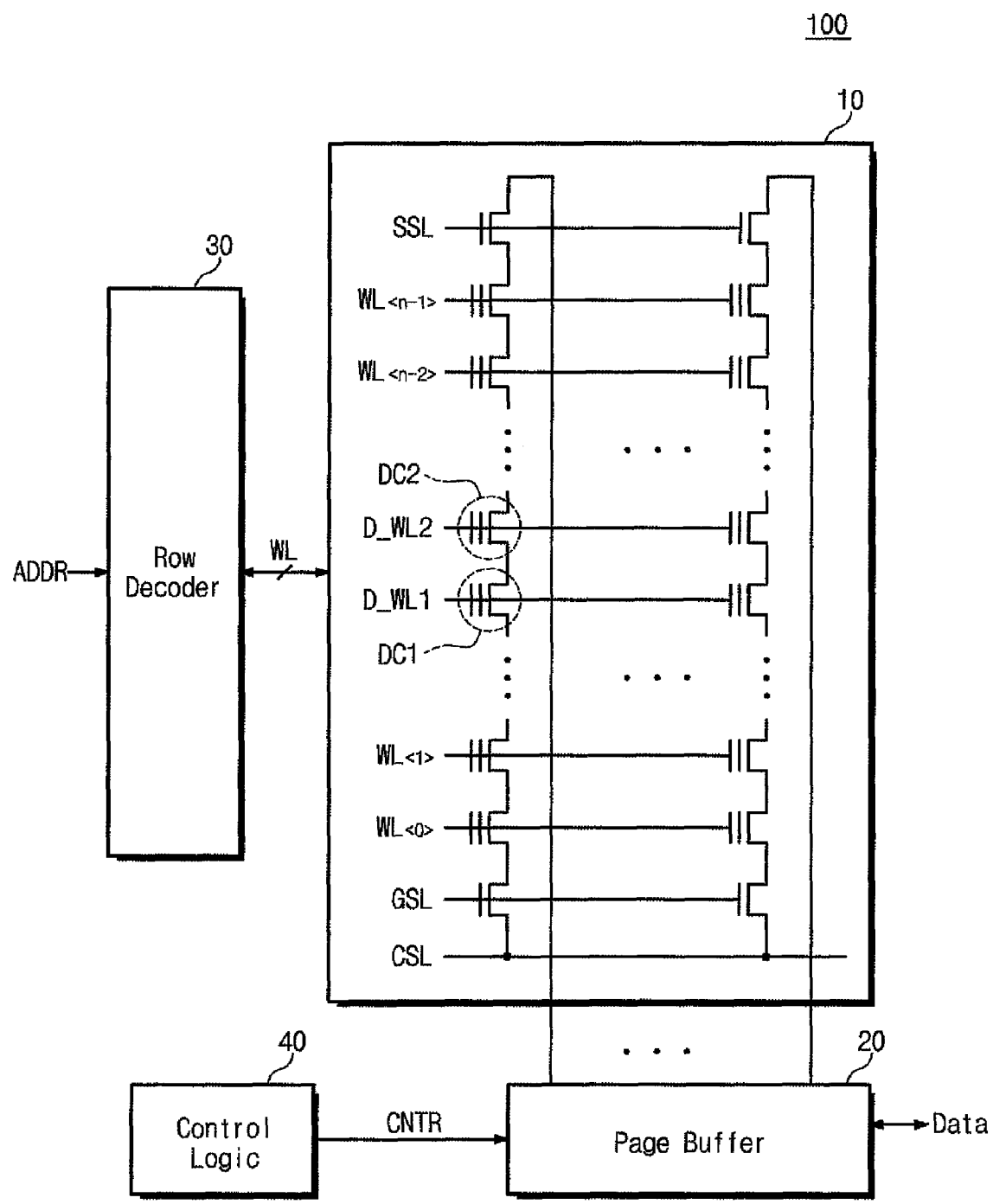
FIG. 1 is a block diagram showing a flash memory device, according to an illustrative embodiment of the present invention.

The present invention will now be described more fully with reference to the accompanying drawings, in which illustrative embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

FIG. 1 is a block diagram showing a flash memory device, according to an illustrative embodiment of the present invention.

Referring to FIG. 1, the depicted embodiment shows a flash memory device having All Bit Line (ABL) architecture. That is, a flash memory device 100 is configured to program memory cells of a selected word line and all bit lines at the same time, and read multiple segments of the programmed cells by a segment unit. For example, an ABL flash memory device may program 8 Kbytes of data at the same time, and may verify or read the 8 Kbytes of programmed data by two operations on 4 Kbytes of data, each.

The flash memory device 100 includes multiple strings 10, a page buffer 20, a row decoder 30, and control logic 40. In the depicted embodiment, each of the strings 10 includes first and second dummy cells DC1 and DC2 and multiple normal cells. The page buffer 20 is used to write data to or read data from the strings 10. The row decoder 30 receives an address ADDR from an external device, such as a memory controller (not shown). The row decoder 30 selects one of word lines connected with the strings 10 in response to the received address ADDR. The control logic 40 controls write and read operations of the page buffer 20.

In various embodiments of the present invention, the number of dummy cells included in each of the strings 10 is the same as a read frequency. For example, as stated above, the flash memory device 100 may program 8 Kbytes of data in memory cells at the same time in a program operation, and read the programmed cells twice, reading 4 Kbytes of data each time, in read operations, thus having a read frequency of two. Therefore, in the illustrative embodiment, each of the strings 10 includes two dummy cells. In other words, in an embodiment, there are N dummy cells in each string 10 and each string 10 is read N times.

Figure 2:
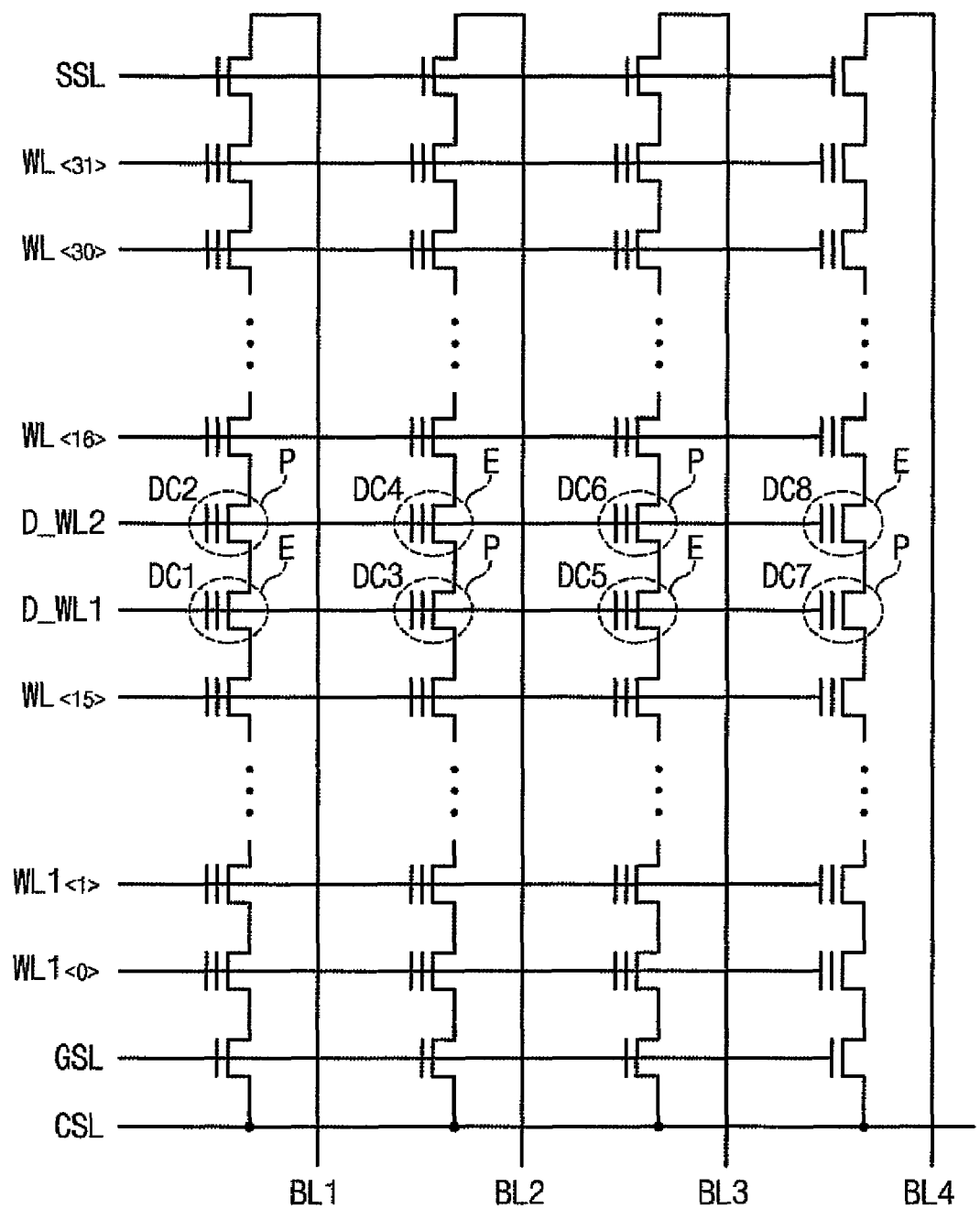
FIG. 2 is a circuit diagram showing a portion of multiple strings of a flash memory device, according to a first illustrative embodiment of the present invention.

FIG. 2 is a circuit diagram showing a portion of the strings in a flash memory device, such as the flash memory device illustrated in FIG. 1, according to a first illustrative embodiment of the present invention.

Referring to FIG. 2, representative strings 10 are shown to include first to fourth bit lines BL1 to BL4, each of which is connected to a corresponding string having two dummy cells. That is, the first bit line BL1 is connected to a string 10, which includes first and second dummy cells DC1 and DC2; the second bit line BL2 is connected to a string 10, which includes third and fourth dummy cells DC3 and DC4; the third bit line BL3 is connected to a string 10 which includes fifth and sixth dummy cells DC5 and DC6; and the fourth bit line BL4 is connected to a string 10 which includes seventh and eighth dummy cells DC7 and DC8.

The second, third, sixth and seventh dummy cells DC2, DC3, DC6 and DC7 are in a programmed state (indicated by "P"), and the first, fourth, fifth and eighth dummy cells DC1, DC4, DC5 and DC8 are at an erased state (indicated by "E"). A programming operation of the first to eighth dummy cells DC1 to DC8 will be more fully described referencing FIG. 3, and a verify operation for strings 10 including the dummy cells in FIG. 2 will be more fully described referencing FIG. 4.

Figure 7:
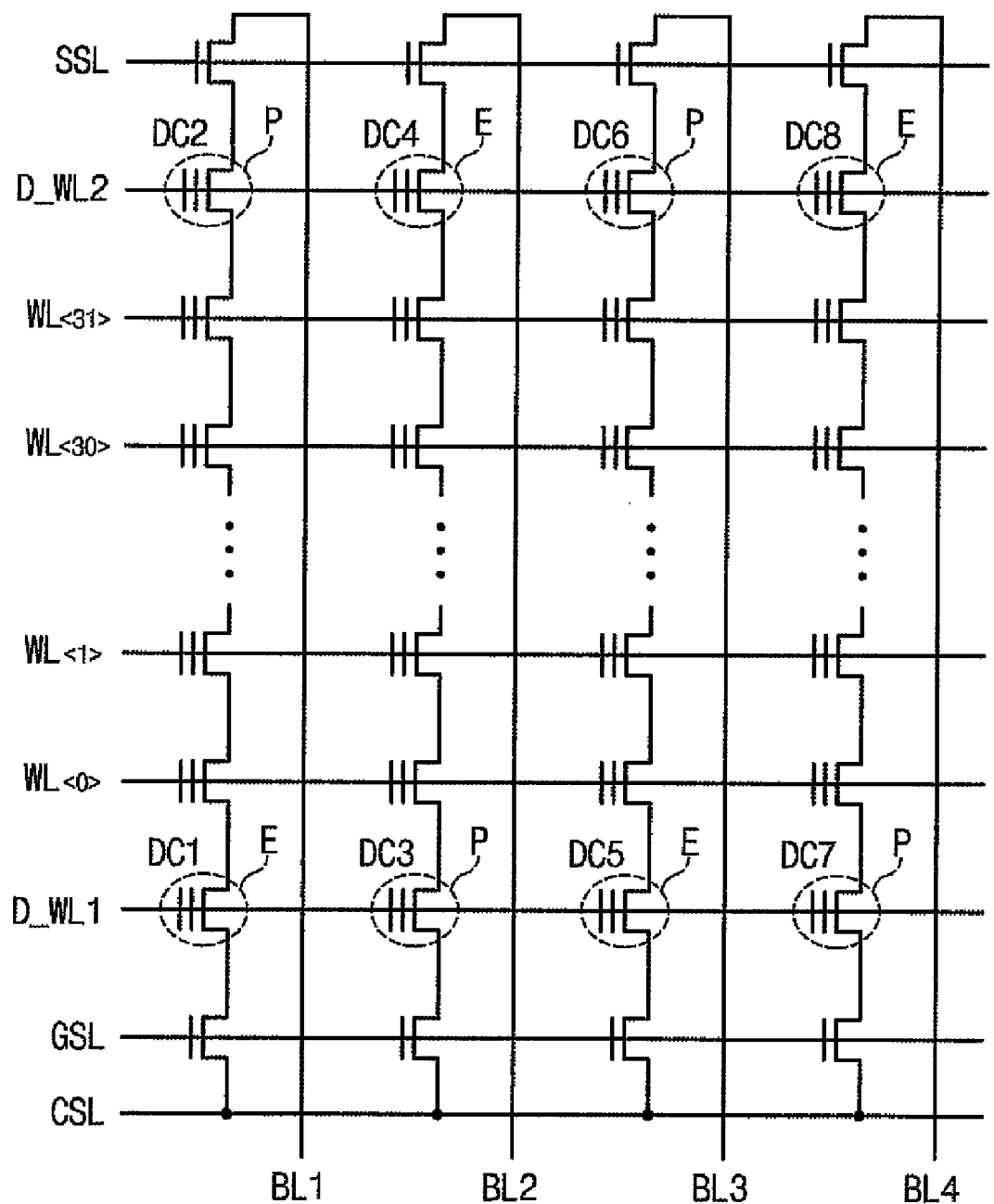
FIG. 7 is a circuit diagram showing a portion of multiple strings of a flash memory device, according to a second illustrative embodiment of the present invention.
Figure 8:
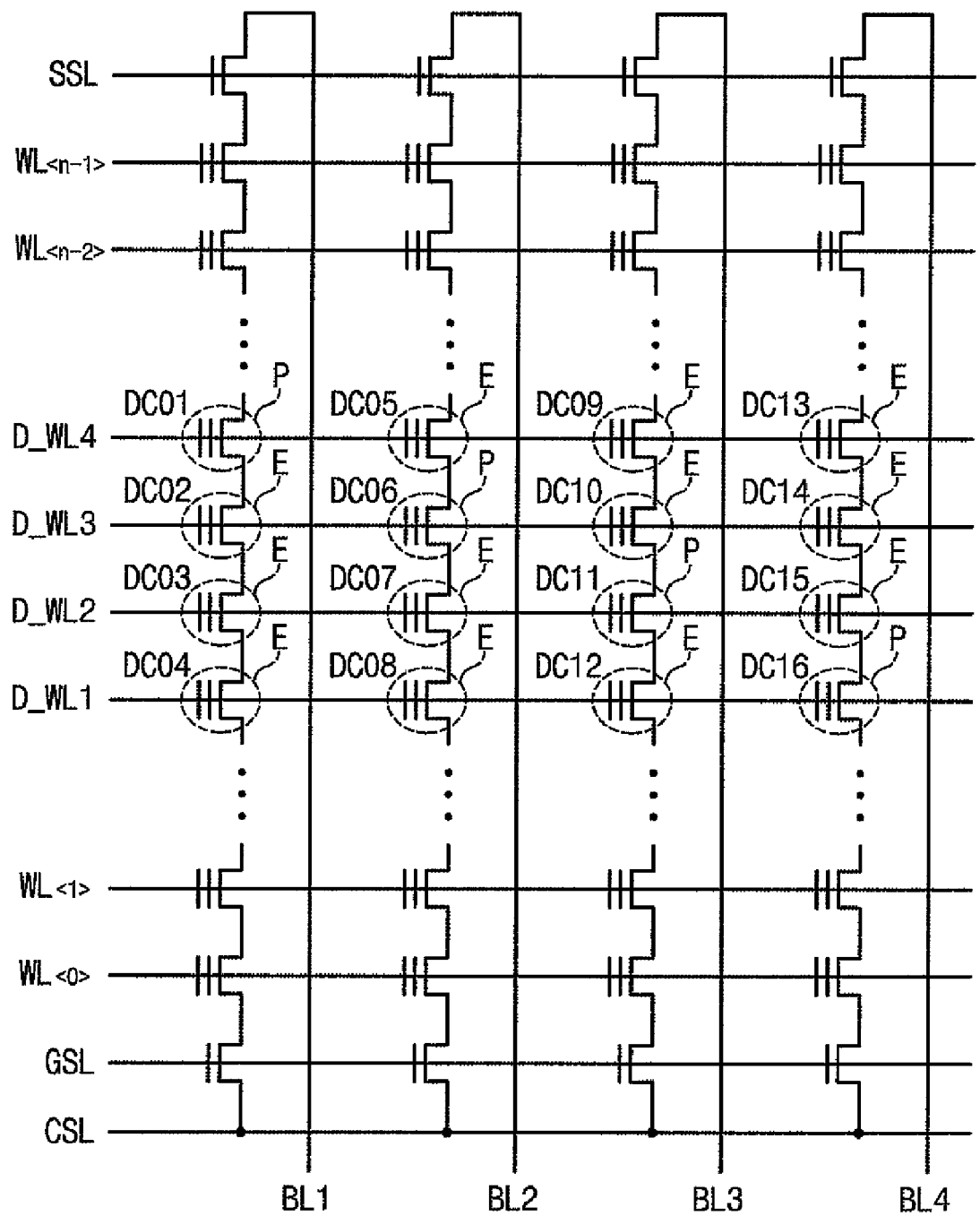
FIG. 8 is a circuit diagram showing a portion of multiple strings of a flash memory device, according to a third illustrative embodiment of the present invention.

According to an embodiment, the first to eighth dummy cells DC1 to DC8 are arranged in sets of two dummy cells (e.g., DC1 and DC2, DC3 and DC4, DC5 and DC6, DC7 and DC8) located between normal cells. Other arrangements of dummy cells, according to alternative embodiments of the present invention, are illustrated in FIGS. 7 and 8.

Figure 3:
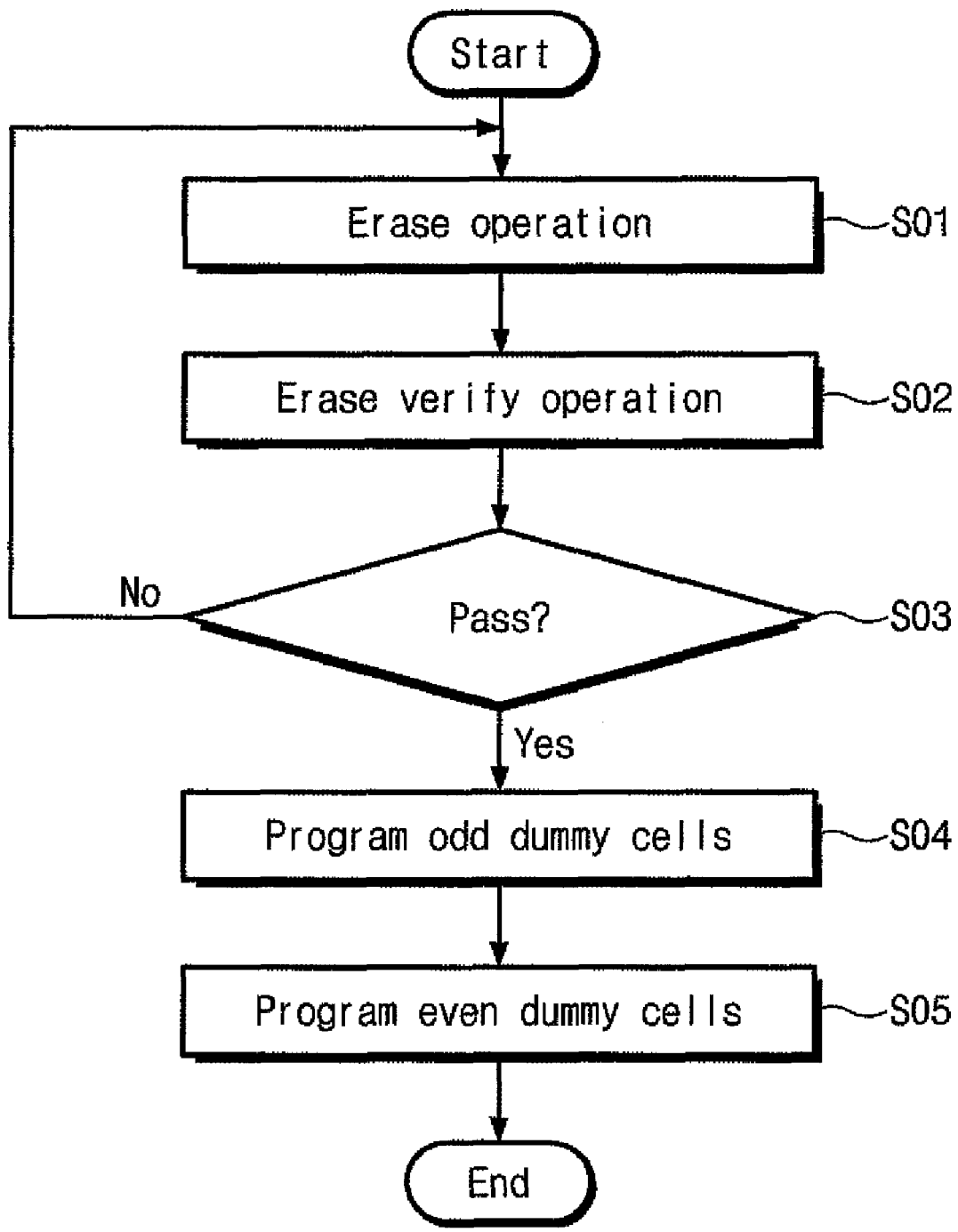
FIG. 3 is a flow chart showing a program sequence of dummy cells illustrated in FIG. 2, according to an illustrative embodiment of the present invention.

FIG. 3 is a flow chart showing a program sequence of dummy cells illustrated in FIG. 2, according to an illustrative embodiment of the present invention.

Referring to FIGS. 1 and 3, a flash memory device according to the illustrative embodiment performs an erase operation, in which cells in stings 10 connected to the first to fourth bit lines BL1 to BL4 are erased (step S01). In step S02, an erase verify operation is carried out with respect to the erased cells. In step S03, the flash memory device 100 checks whether the erased cells have a predetermined threshold voltage. When at least one of the erased cells is determined to have the predetermined threshold voltage, the procedure returns to step S01 to repeat the erase and erase verify operations. When all of the cells have been verified as having been erased, the procedure proceeds to step S04, in which the first, third, fifth and seventh dummy cells DC1, DC3, DC5 and DC7 are programmed. Then, in step S05, the second, fourth, sixth and eighth dummy cells DC2, DC4, DC6 and DC8 are programmed.

Figure 4:
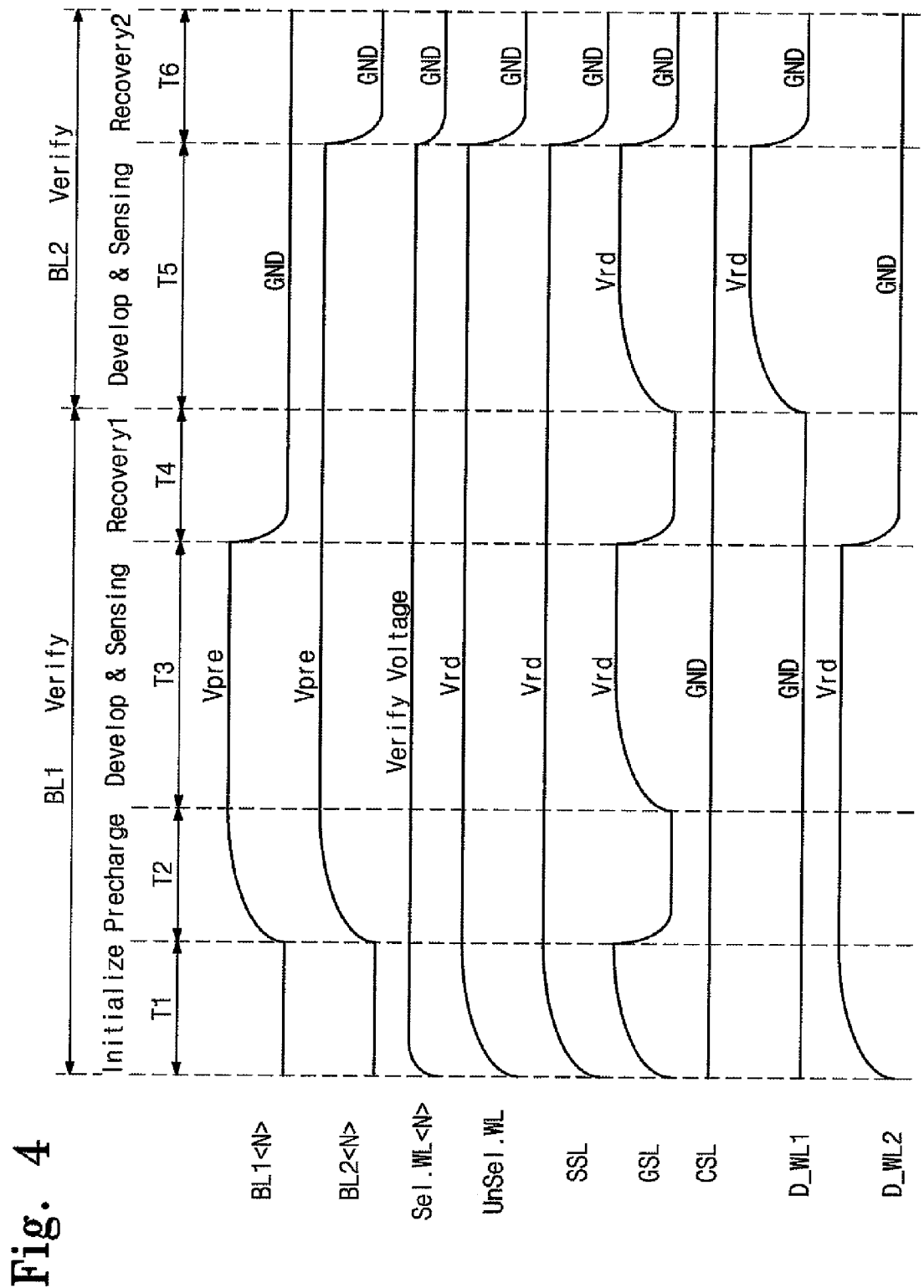
FIG. 4 is a timing diagram showing a verify operation of a flash memory device, according to an illustrative embodiment of the present invention.

FIG. 4 is a timing diagram showing a verify operation of a flash memory device, according to an illustrative embodiment of the present invention.

In the depicted embodiment, the flash memory device simultaneously programs memory cells having strings 10 connected to a selected word line and all bit lines, and verifies the programmed memory cells connected to all of the bit lines by performing two verify operations, first on one half and second on the other half of the programmed memory cells, as more fully described below.

Referring to FIGS. 1 to 4, during time period T1, the first and second bit lines BL1 and BL2 are initialized to ground voltage GND. In order to sense the first bit line BL1, word line D_WL1, which includes the first dummy cell DC1 of a string 10 connected to the first bit line BL1, is supplied with ground voltage GND, and word line D_WL2 which includes the second dummy cell DC2 of the string 10 connected to the first bit line BL1, is supplied with read voltage Vrd. A verify voltage is applied to a selected word line, and the read voltage Vrd is applied to unselected word lines.

In illustrative embodiments of the present invention, the read voltage Vrd is higher than a threshold voltage of the respective cells. Accordingly, the coupling effect of the second bit line BL2 is removed by blocking sensing of the second bit line BL2 during a sensing period of the first bit line BL1.

During time period T2, the first and second bit lines BL1 and BL2 are pre-charged by applying pre-charge voltage Vpre. When the first and second bit lines BL1 and BL2 are pre-charged at the same time, coupling capacitances between the first and second bit lines BL1 and BL2 are eliminated, reducing the pre-charge time.

During time period T3, the first bit line BL1 is sensed. As ground voltage GND is applied to the first dummy cell DC1 and the read voltage Vrd is applied to the second dummy cell DC2, the page buffer 20 senses cell current of the first bit line BL1.

Likewise, ground voltage GND is applied to the third dummy cell DC3, and read voltage Vrd is applied to the fourth dummy cell DC4. This enables the second bit line BL2 to be blocked, so that pre-charge voltage Vpre is maintained. That is, the page buffer 20 continues to apply the pre-charge voltage Vpre to the second bit line BL2.

During time period T4, the pre-charge voltage Vpre of the first bit line BL1 is discharged. The second bit line BL2 is maintained at the pre-charge voltage Vpre.

During time period T5, the second bit line BL2 is sensed. As the second bit line BL2 is maintained at the pre-charge voltage Vpre, the page buffer 20 senses the second bit line BL2 instantly, that is, without a pre-charge operation of the second bit line BL2.

The third dummy cell DC3 is supplied with read voltage Vrd, and the fourth dummy cell DC4 is supplied with ground voltage GND, through word line D_WL1 and word line D_WL2, respectively. The page buffer 20 senses cell current of the second bit line BL2. Likewise, the read voltage Vrd is applied to the dummy cell DC1 and ground voltage GND is applied to the second dummy cell DC2. This causes the first bit line BL1 to be blocked by the second dummy cell DC2.

During time period T6, the second bit line BL2 is discharged to ground voltage GND, and the verify operation ends.

According to the above-described verify operation, since the first and second bit lines BL1 and BL2 are pre-charged at the same time, no coupling capacitances exist between adjacent bit lines BL1 and BL2. It is possible to reduce the time needed to pre-charge the first and second bit lines BL1 and BL2, and to skip time needed to pre-charge the second bit line BL2. Accordingly, the time for conducting the verify operation is reduced. Further, a read operation may be applied in the same manner as the verify operation.

As a result, the flash memory device, according to the depicted embodiment, has reduced verify/read times for strings having dummy cells.

Figure 5:
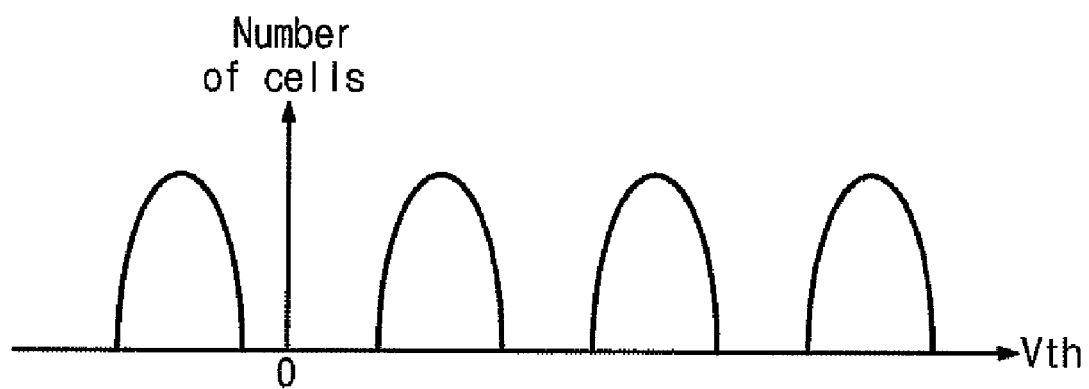
FIG. 5 is a diagram showing threshold voltage distributions corresponding to a multi-level cell (MLC) program operation of dummy cells illustrated in FIG. 2, according to an illustrative embodiment of the present invention.
Figure 6:
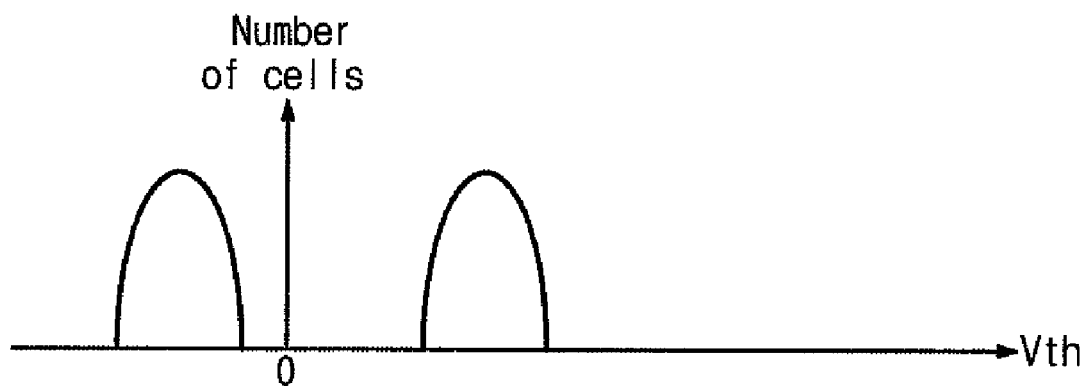
FIG. 6 is a diagram showing threshold voltage distributions corresponding to a single-level cell (SLC) program operation of dummy cells illustrated in FIG. 2, according to an illustrative embodiment of the present invention.

FIG. 5 is a diagram showing threshold voltage distributions according to a multi-level cell (MLC) program operation of dummy cells illustrated in FIG. 2, and FIG. 6 is a diagram showing threshold voltage distributions according to a single-level cell (SLC) program operation of dummy cells illustrated in FIG. 2.

According to alternative embodiments, the first to eighth dummy cells DC1 to DC8 depicted in FIG. 2, for example, may be programmed according to an MLC program operation as illustrated in FIG. 5, or according to an SLC program operation as illustrated in FIG. 6.

FIG. 7 is a circuit diagram showing a portion of the strings in a flash memory device, according to a second illustrative embodiment of the present invention. Referring to FIG. 7, each of strings 110 includes normal cells located between two dummy cells.

For example, the first bit line BL1 is connected to a string 110 which includes normal cells located between the first dummy cell DC1 and the second dummy cell DC2; the second bit line BL2 is connected to a string 110 which includes normal cells located between the third dummy cell DC3 and the fourth dummy cell DC4; the third bit line BL3 is connected to a string 110 which includes normal cells located between the fifth dummy cell DC5 and the sixth dummy cell DC6; and the fourth bit line BL4 is connected to a string 10 which includes normal cells located between the seventh dummy cell DC7 and the eighth dummy cell DC8.

The second, third, sixth and seventh dummy cells DC2, DC3, DC6 and DC7 are in a programmed state (indicated by "P"). The first, fourth, fifth and eighth dummy cells DC1, DC4, DC5 and DC8 are in an erased state (indicated by "E").

A flash memory device according to the depicted embodiment includes dummy cells placed at both ends of each of strings with normal cell located between them. In general, by placing the dummy cells at both ends of a string, characteristics of the normal cells located near the ends of each the string are the same as corresponding characteristics of the normal cells located in the middle of the string. In various alternative embodiments of the present invention, locations of the normal cells in relation to the dummy cells may vary.

FIG. 8 is a circuit diagram showing a portion of the strings in a flash memory device, according to a third embodiment of the present invention. It is assumed that all bit lines are divided into four segments and verify/read operations are carried out with respect to each of the four segments of bit lines.

Referring to FIG. 8, a flash memory device according to the third embodiment of the present invention sequentially verifies the first to fourth bit lines BL1 to BL4.

Each of the first to fourth bit lines BL1 to BL4 is connected to a string, which includes four dummy cells. For example, the first bit line BL1 is connected to a string which includes dummy cells DC01 to DC04; the second bit line BL2 is connected to a string which includes dummy cells DC05 to DC08; the third bit line BL3 is connected to a string which includes dummy cells DC09 to DC12; and the fourth bit line BL4 is connected to a string which includes dummy cells DC13 to DC16.

The dummy cells DC01, DC06, DC11 and DC16 are set to a programmed state (indicated by "P"). The dummy cells DC2, DC3, DC4, DC5, DC7, DC8, DC9, DC10, DC12, DC13, DC14 and DC15 are set to an erased state (indicated by "E").

A verify operation of the first to fourth bit lines BL1 to BL4 is performed the same as described with respect to FIG. 4, above. That is, in the first to fourth bit lines BL1 to BL4, a programmed dummy cell of a bit line connected to a memory cell in a selected word line is supplied with read voltage, and an erased dummy cell of a bit line connected to a memory cell in a selected word line is supplied with ground voltage. Further, a programmed dummy cell of a bit line connected to a memory cell in an unselected word line is supplied with ground voltage, and an erased dummy cell of a bit line connected to a memory cell in an unselected word line is supplied with read voltage. Accordingly, the first to fourth bit lines BL1 to BL4 are pre-charged at the same time and a sensing operation is sequentially carried out via the first to fourth bit lines BL1 to BL4.

Figure 9:
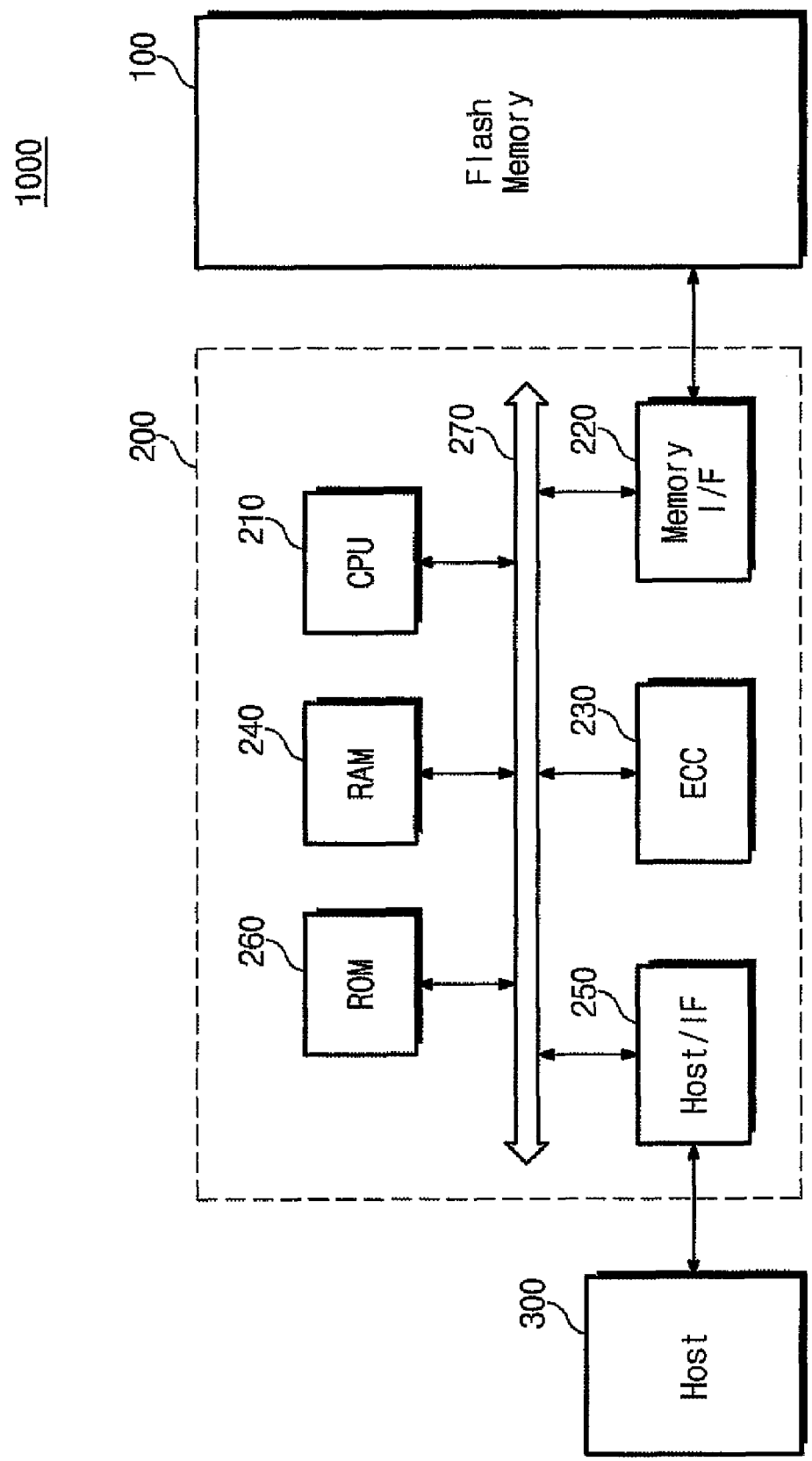
FIG. 9 is a block diagram showing a flash memory system, according to various illustrative embodiments of the present invention.

FIG. 9 is a block diagram showing a flash memory system including a flash memory device according to the first to third embodiments of the present invention.

Referring to FIG. 9, a flash memory system 1000 includes a flash memory device 100, a flash memory controller 200 and a host 300.

The flash memory controller 200 may include central processing unit (CPU) 210, memory interface 220, error correction circuit (ECC) 230, random access memory (RAM) 240, host interface 250 and read-only memory (ROM) 260, which are connected via a bus 270.

The flash memory device 100 includes dummy cells, as shown for example in the illustrative embodiments depicted in FIGS. 2, 7 and 8.

In FIG. 9, the flash memory controller 200 and the flash memory device 100 may be included in a storage device, which is a portable storage device such as Universal Serial Bus (USB) memory, a multimedia card (MMC), an SD card, an xD card, a CompactFlash® (CF) card, a subscriber identity module (SIM) card, or the like. Such a portable storage device may be connected with the host 300, such as computer, notebook, digital camera, cellular phone, MP3 player, portable multimedia player (PMP), game machine, or the like. The host interface 250 is configured to interface with the host 300.

The flash memory controller 200 receives read requests with respect to the flash memory device 100 from the host 300, and controls the flash memory device 100, so that a word line is selected and a read operation is performed.

The CPU 210 is configured to control read and/or write operations of the flash memory device 100, for example, according to requests of the host 300. The memory interface 220 is configured to interface with the flash memory device 100.

The ECC 230 is configured to generate ECC data using data (main data) transferred to the flash memory device 100. The generated ECC data may be stored in a spare area of the flash memory device 100, for example. In an embodiment, the ECC 230 is configured to detect an error of data read out from the flash memory device 100. When the detected error is within a correctable range, the ECC 230 may correct the detected error. In various embodiments, the ECC 230 may be located in the flash memory device 100 or in the flash memory controller 200, depending on the configuration of the flash memory system 1000.

In an embodiment, the ROM 260 stores data, such as boot code. The RAM 240 may be a dynamic RAM (DRAM), a static RAM (SRAM), or the like, and may be used as a buffer memory. For example, the RAM 240 may temporarily store data read out from the flash memory device 100 or provided from the host 300. Further, the RAM 240 may be used for flash translation layer (FTL) operations, implemented by the CPU 210.

In the depicted embodiment, the flash memory device 100 may store single-bit data or multi-bit data per cell.

Embodiments of the present invention reduce verify and/or read times of flash memory devices, including flash memory devices having ABL architecture, for example.

While the present invention has been shown and described in connection with illustrative embodiments thereof, it will be apparent to those skilled in the art that various modifications can be made without departing from the spirit and scope of the invention as defined by the appended claims.

What is claimed is:

1. A flash memory device comprising:
a plurality of strings, each string comprising memory cells and dummy cells, the number of dummy cells in each string being the same as the number of read operations required to read the memory cells of the plurality of strings,
wherein one dummy cell of the dummy cells in each string is set to a programmed state, and remaining dummy cells are set to an erased state during each of the read operations.

2. The flash memory device of claim 1, wherein one of the dummy cells is set to a programmed state and dummy cells of other strings, in a same row as the one of the dummy cells, are set to an erased state.

3. The flash memory device of claim 1, wherein during a read operation, a read voltage is applied to the one of the dummy cells set to the programmed state.

4. The flash memory device of claim 3, wherein during the read operation, the plurality of strings are pre-charged simultaneously.

5. The flash memory device of claim 1, wherein the dummy cells in each of the plurality of strings are selectively programmed after an erase/verify operation.

* * * * *